US011017995B2

(12) United States Patent
Chen et al.

(10) Patent No.: US 11,017,995 B2
(45) Date of Patent: May 25, 2021

(54) COMPOSITION FOR TIN HARD MASK REMOVAL AND ETCH RESIDUE CLEANING

(71) Applicant: Versum Materials US, LLC, Tempe, AZ (US)

(72) Inventors: Chao-Hsiang Chen, Hsinchu (TW); Yi-Chia Lee, Chupei (TW); Wen Dar Liu, Zhubei (TW); Chung-Yi Chang, Chupei (TW)

(73) Assignee: Versum Materials US, LLC, Tempe, AZ (US)

( * ) Notice: Subject to any disclaimer, the term of this patent is extended or adjusted under 35 U.S.C. 154(b) by 45 days.

(21) Appl. No.: 16/516,405

(22) Filed: Jul. 19, 2019

(65) Prior Publication Data

US 2020/0035485 A1    Jan. 30, 2020

Related U.S. Application Data

(60) Provisional application No. 62/703,603, filed on Jul. 26, 2018.

(51) Int. Cl.
*C11D 7/26* (2006.01)
*C11D 7/32* (2006.01)
(Continued)

(52) U.S. Cl.
CPC .......... *H01L 21/02068* (2013.01); *B08B 3/04* (2013.01); *B08B 3/10* (2013.01); *C11D 7/261* (2013.01); *C11D 7/265* (2013.01); *C11D 7/267* (2013.01); *C11D 7/3209* (2013.01); *C11D 7/3281* (2013.01); *C11D 7/34* (2013.01);
(Continued)

(58) Field of Classification Search
CPC ......... C11D 7/261; C11D 7/265; C11D 7/267; C11D 7/34; C11D 7/3209; C11D 7/3281; C11D 7/50; C11D 7/5068; C11D 7/5077; C11D 7/5095; B08B 3/04; B08B 3/08
USPC ....... 510/175, 176, 245, 254, 255, 258, 264, 510/265, 477, 488, 499, 500, 501, 505, 510/506; 134/1.3
See application file for complete search history.

(56) References Cited

U.S. PATENT DOCUMENTS

2009/0203566 A1*  8/2009  Lee ..................... C11D 11/0047
                                                               510/175
2010/0151610 A1*  6/2010  Choung ................. G03F 7/425
                                                               438/34
(Continued)

FOREIGN PATENT DOCUMENTS

EP        3089200 A1    2/2016
WO     2014197808 A1   12/2014
(Continued)

*Primary Examiner* — Gregory R Delcotto
(74) *Attorney, Agent, or Firm* — William T. Slaven, IV (57) ABSTRACT

Composition, method and system for TiN hard mask removal from electronic circuitry devices, such as advanced pattern wafers have been disclosed. The cleaning compositions preferably comprise an etchant agent (also referred to as a base), an oxidizing agent, an oxidizing stabilizer (also referred to as a chelating agent), an ammonium salt, a corrosion inhibitor, and a solvent. Other optional additives could be provided. It is preferable that the pH of the cleaning composition be greater than 5.5. The cleaning composition is preferably free from dimethyl sulfoxide and tetramethylammonium hydroxide.

16 Claims, 2 Drawing Sheets

(51) Int. Cl.
- *C11D 7/50* (2006.01)
- *H01L 21/02* (2006.01)
- *C11D 7/34* (2006.01)
- *B08B 3/04* (2006.01)
- *B08B 3/10* (2006.01)
- *H01L 21/3213* (2006.01)

(52) U.S. Cl.
CPC .............. *C11D 7/50* (2013.01); *C11D 7/5068* (2013.01); *C11D 7/5077* (2013.01); *C11D 7/5095* (2013.01); *H01L 21/32137* (2013.01); *H01L 21/32139* (2013.01)

(56) References Cited

U.S. PATENT DOCUMENTS

| | | |
|---|---|---|
| 2015/0104952 A1 | 4/2015 | Cui |
| 2017/0107460 A1 | 4/2017 | Liu |
| 2018/0230333 A1 | 8/2018 | Reichardt |

FOREIGN PATENT DOCUMENTS

| | | |
|---|---|---|
| WO | 2015053800 A2 | 4/2015 |
| WO | 2016042408 A2 | 3/2016 |
| WO | 2016115153 A1 | 7/2016 |

\* cited by examiner

COMPOSITION FOR TIN HARD MASK REMOVAL AND ETCH RESIDUE CLEANING

CROSS-REFERENCE TO RELATED APPLICATIONS

This application claims priority to U.S. provisional application 62/703,603 filed on Jul. 26, 2018, the entire contents of which is incorporated herein by reference thereto for all allowable purposes.

BACKGROUND OF THE INVENTION

As scaling continues to ever smaller feature sizes, integrated circuit (IC) reliability is an increasing concern in IC fabrication technology. The impact of trace interconnect failure mechanisms on device performance and reliability demand much more from integration schemes, interconnect materials, and processes. An optimal low-k dielectric material and its related deposition, pattern lithography, etching and cleaning are required to form dual-damascene interconnect patterns.

The dual-damascene process involves forming a photoresist mask, typically a titanium, or titanium nitride (TiN) on a low-k dielectric layer overlying a metal conductor layer, such as a copper or a cobalt layer. The low-k dielectric layer is then etched in those regions not protected by the photoresist mask to form a via and/or trench that expose the metal conductor layer. The via and trench, commonly known as dual-damascene structure, are usually defined using two lithography steps. The photoresist mask is then removed from the low-k dielectric layer before a conductive material is deposited into the via and/or trench to form an interconnect. A hard-mask scheme approach of interconnects-patterning wafer fabrication allows the transfer of patterns into the under layers with tightest optimal dimension control.

Compositions have been developed to pull back or remove these types of metal hard-masks from substrates. It has been observed that commonly used mask removal agents, with conventional corrosion inhibitors, may contaminate the underlying metal layers of copper or cobalt, through absorption onto the metal surface. These contaminants, along with etch residues of the chemical elements present on the substrate are often difficult to remove. A post-treatment step with a cleaning component, such as dilute hydrofluoric acid (DHF), may be employed to remove the contaminants. Unless these contaminants are adequately removed by post-processing cleaning, the rejection rate of the produced components, as may be determined by wafer acceptance testing, will remain unacceptably high. However, the additional post-processing step with a chemical such as DHF, to clean off the contaminants results in greater costs and complexity in the manufacture of integrated circuit boards. Accordingly, what is needed is a hard mask removal agent that will not damage the underlying dielectric material, or corrode the metallic materials, and does not leave a residue on the cobalt and copper materials that would otherwise require additional post-processing cleaning in DHF.

BRIEF SUMMARY OF THE INVENTION

This invention provides compositions, methods and systems for selectively removing at least one of titanium nitride and photoresist etch residue material from the surface of a microelectronic device having same thereon. In a first aspect the composition comprises oxidizing agent; solvent; etchant agent; ammonium salt; metal corrosion inhibitor; optional fluoride source, and optional weak acid, wherein the composition has a pH ranging from 5.5 to 14. In another aspect, alone and in any combination with one or more other aspects, the metal corrosion inhibitor is selected from 1,2,4-triazole (TAZ), benzotriazole (BZT), methyl-1H-benzotriazole, tolyltriazole (TTL), 2-aminobenthothiazole, benzimidazole, 2-mercapto-5-methylbenzimidazole, 8-hydroxyquinoline, 1-thioglycerol, ascorbic acid, pyrazole, sorbitol, maltitol, mannitol, theophylline, caffeine, polyethylene glycol, poly(propylene glycol), triton X-100, surfynol-485, uric acid, decanoic acid, 11-mercaptoundecanoic acid (MUDA), hexadecyl trimethylammonium p-toluene sulfonte (CTAT), hexylamine, 3,4-diaminotoluene, p-anisidin, 4-Methyl-o-phenylenediamine, 4-Nitroaniline, 4-carboxy-o-phenylenediamine, 8-aminoquinoline, 5-Amino-2-benzimidazolinone, N,N-dimethyl-p-phenylenediamine, and combinations thereof or the metal corrosion inhibitor is selected from sorbitol, maltitol, mannitol, theophylline, tolyltriazole (TTL), 11-mercaptoundecanoic acid (MUDA), poly(propylene glycol) (PEG400), triton X-100, 3,4-diaminotoluene, p-anisidine, 4-methyl-o-phenylenediamine, 4-nitroaniline, 4-carboxy-o-phenylenediamine, 8-aminoquinoline, 5-amino-2-benzimidazolinone, and combinations thereof, or the metal corrosion inhibitor is selected from theophylline, sorbitol, maltitol, tolyltriazole (TTL), 3,4-diaminotoluene,11-mercaptoundecanoic acid (MUDA), p-anisidine, 4-methyl-o-phenylenediamine, 4-Nitroaniline, 4-carboxy-o-phenylenediamine, 8-aminoquinoline, 5-amino-2-benzimidazolinone, and combinations thereof; or the metal corrosion inhibitor is selected from theophylline, sorbitol, maltitol, 3,4-diaminotoluene,11-mercaptoundecanoic acid (MUDA), p-anisidine, 4-methyl-o-phenylenediamine, 4-Nitroaniline, 4-carboxy-o-phenylenediamine, 8-aminoquinoline, 5-amino-2-benzimidazolinone and combinations thereof; or the metal corrosion inhibitor is selected from theophylline or sorbitol and combinations thereof.

In another aspect, alone or in combination with any, some or all of the other aspects, the etchant agent is selected from tetraethylammonium hydroxide (TEAH), trimethylphenylammonium hydroxide (TMPAH), tetramethylammonium hydroxide (TMAH), tetrapropylammonium hydroxide (TPAH), tetrabutylammonium hydroxide (TBAH), choline hydroxide, ammonium hydroxide, benzyltriethylammonium hydroxide (BTEAH), tetrabutylphosphonium hydroxide (TBPH), (2-hydroxyethyl) trimethylammonium hydroxide, (2-hydroxyethyl) triethylammonium hydroxide, (2-hydroxyethyl) tripropylammonium hydroxide, (1-hydroxypropyl) trimethylammonium hydroxide, ethyltrimethylammonium, hydroxide, diethyldimethylammonium hydroxide, (DEDMAH), dimethyldipropylammonium hydroxide, diethylenetriamine, monoethanolamine, 1,8-diazabicyclo(5.4.0)undec-7-ene, triethanolamine, 1-amino-2-propanol, 3-morpholinopropylamine, 1-(2-aminoethyl)piperazine, N-(2-hydroxyethyl)-ethylenediamine, 2-(methylamino) ethanol, and combinations thereof or selected from tetraethylammonium hydroxide (TEAH), choline hydroxide, tetramethylammonium hydroxide (TMAH), trimethylphenylammonium hydroxide (TMPAH), tetrabutylammonium hydroxide (TBAH), ethyltrimethylammonium, hydroxide, ammonium hydroxide, 1,8-diazabicyclo(5.4.0)undec-7-ene, 1-(2-aminoethyl)piperazine, and combinations thereof; or the etchant agent is selected from 1,8-diazabicyclo(5.4.0) undec-7-ene, 1-(2-aminoethyl)piperazine, and combinations thereof.

In another aspect, alone or in any combination with any, some or all of the other aspects, the composition includes an oxidizing stabilizer and/or the oxidizing stabilizer may be selected from glycine, serine, proline, leucine, alanine, asparagine, aspartic acid, glutamine, glutamic acid, valine, lysine, and cystine, nitrilotriacetic acid (NTA), iminodiacetic acid (IDA), ethylenediaminetetraacetic acid (EDTA), (1,2-cyclohexylenedinitrilo)tetraacetic acid (CDTA), uric acid, tetraglyme, diethylenetriamine pentaacetic acid (DTPA), propylenediamine-N,N,N',N'-tetraacetic acid, ethylendiamine disuccinic acid (EDDS), sulfanilamide, 1,4,7,10-tetraazacyclododecane-1,4,7,10 tetraacetic acid; ethylene glycol tetraacetic acid (EGTA); 1.2-bis(o-aminophenoxy) ethane-N,N,N',N'-tetraacetic acid; N-2-bis(carboxymethyl) aminoethyl-N-(2-hydroxy ethyl)glycine (HEDTA); and ethylenediamine-N,N'-bis(2-hydroxyphenylacetic acid) (EDDHA), 1,3-diaminopropane-N,N,N',N'-tetraacetic acid, gluconic acid, N,N,N',N'-ethylenediaminetetrakis(methylenephosphonic acid) (EDTMP), diethylenetriamine penta (methylene phosphonic acid) (ETDMP), nitrilotris(methylene)triphosphonic acid (ATMP), tartaric acid, 3,4-dihydroxybenzoic acid, Salicylic acid, 8-Hydroxyquinoline (8-HQ), etidronic acid (HEDP), 1,3-propanediamine-N,N,N',N'-tetraacetic acid, triethylenetetramine hexaacetic acid (TTNA), picolinic acid, and combinations thereof, or the oxidizing stabilizer is selected from glycine, serine, proline, leucine, alanine, asparagine, aspartic acid, glutamine, glutamic acid, valine, lysine, and cystine, nitrilotriacetic acid (NTA), iminodiacetic acid (IDA), ethylenediaminetetraacetic acid (EDTA), (1,2-cyclohexylenedinitrilo)tetraacetic acid (CDTA), gluconic acid, N-2-bis(carboxymethyl)aminoethyl-N-(2-hydroxy ethyl)glycine (HEDTA), nitrilotris(methylene)triphosphonic acid (ATMP), tartaric acid, 3,4-dihydroxybenzoic acid, salicylic acid, 8-hydroxyquinoline (8-HQ), etidronic acid (HEDP), and combinations thereof.

In another aspect, alone or in any combination with any, some or all of the other aspects, the composition includes a weak acid. The weak acid may be selected from citric acid, oxalic acid, malonic acid, lactic acid, adipic acid, acetic acid, methanesulfonic acid, p-toluenesulfonic acid, and combinations thereof.

In another aspect, alone or in any combination with any, some or all of the other aspects, the composition includes an oxidizing agent selected from hydrogen peroxide, ammonium persulfate, peracetic acid, peroxybenzoic acid, oxone ($2KHSO_5 \cdot KHSO_4 \cdot K_2SO_4$), n-methylmorpholine oxide (NMMO or NMO), benzoyl peroxide, tetrabutylammonium peroxymonosulfate, ferric chloride, permanganate peroxoborate, periodic acid, iodic acid, vanadium (V) oxide, vanadium(IV, V) oxide, ammonium vanadate, perchlorate, persulfate, ammonium peroxydisulfate, per acetic acid, urea hydroperoxide, nitric acid ($HNO_3$), ammonium hypochlorite ($NH_4ClO$), ammonium tungstate (($NH_4)_{10}H_2(W_2O_7)$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), tetramethylammonium chlorite (($N(CH_3)_4$)$ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$), (($CO(NH_2)_2)H_2O_2$), peracetic acid ($CH(CO)OOH$), and combinations thereof.

In another aspect, alone or in any combination with any, some or all of the other aspects, the ammonium salt in the composition is selected from triammonium citrate, ammonium acetate, ammonium malonate, ammonium adipate, ammonium lactate, ammonium iminodiacetate, ammonium chloride, ammonium bromide, ammonium sulfate, ammonium oxalate, ammonium lactate, ammonium tartrate, ammonium citrate tribasic, ammonium acetate, ammonium carbamate, ammonium carbonate, ammonium benzoate, tetraammonium EDTA, ethylenediaminetetraacetic acid diammonium salt, ammonium succinate, ammonium formate, ammonium 1-H-pyrazole-3-carboxylate, and combinations thereof; or ammonium salt may be selected from ammonium citrate tribasic, ammonium acetate, tetraammonium EDTA, ethylenediaminetetraacetic acid diammonium salt, ammonium chloride, ammonium bromide, and combinations thereof.

In another aspect, alone or in any combination with any, some or all of the other aspects, the solvent in the composition includes water and/or one or more non-aqueous solvents selected from sulfolane, dimethyl sulfoxide (DMSO), dimethyl sulfone (DMSO2), DMAC, n-methylpyrrolidone (NMP), diethylene glycol butyl ether, proplyglycol, ethylene glycol, dipropyleneglycolmethyl ether, tripropyleneglycolmethyl ether and combinations thereof.

In another aspect, alone or in any combination with any, some or all of the other aspects, the composition includes a fluoride source selected from $H_2ZrF_6$, $H_2TiF_6$, $HPF_6$, HF, ammonium fluoride, tetrafluoroboric acid, hexafluorosilicic acid, tetrabutylammonium tetrafluoroborate (TBA-BF4), ammonium hexafluorosilicate, ammonium hexafluorotitanate, ammonium bifluoride ($NH_4HF_2$), and tetramethylammonium fluoride (TMAF), and combinations thereof.

In another aspect, alone or in any combination with any, some or all of the other aspects, the composition comprises 1-30 wt percent of the oxidizing agent, 50 ppm-15 wt percent of the etchant agent, 10 ppm-3 wt percent of the ammonium salt, and at least 45 wt percent solvent. In another aspect alone or in any combination with any, some or all of the other aspects, the cleaning composition of the invention comprises (a) concentrated composition that comprises at least 5 wt percent of a solvent, at least 0.5 wt percent of an etchant agent, at least 0.1 wt percent of an ammonium salt, at least 0.1 wt percent of an oxidizing stabilizer, and at least 0.0001 wt percent of a metal corrosion inhibitor; (b) diluting solvent that is present in a ratio of at least 1:100 of concentrated composition to solvent; and (c) oxidizing agent that is at least 1 wt percent of the cleaning composition.

In another aspect, alone or in any combination with any, some or all of the other aspects, the composition includes oxidizing stabilizer selected from HEDTA, 1,3-diaminopropane-N,N,N',N'-tetraacetic acid or gluconic acid.

In another aspect, alone or in any combination with any, some or all of the other aspects is provided a cleaning composition for selectively removing at least one of titanium nitride and photoresist etch residue material from the surface of a microelectronic device having same thereon, said cleaning composition comprising (a) concentrated composition comprising 0.1-30 wt % etchant agent, 0-5 wt % oxidizing stabilizer/chelator, 100 ppm-8 wt % ammonium salt, 0.1 ppm-5 wt % corrosion inhibitor, 34-99.5 wt % solvent, 0-8 wt % fluoride source and 0-10% weak acid, and (b) oxidizing agent combined with the concentrated composition in a weight ratio of 99:1 to 1:99.

In another aspect, alone or in any combination with any, some or all of the other aspects, the invention provides a cleaning composition for selectively removing at least one of titanium nitride and photoresist etch residue material from the surface of a microelectronic device having same thereon, said cleaning composition comprising (a) concentrated composition comprising 0.1-30 wt % etchant agent, 0-5 wt % oxidizing stabilizer/chelator, 100 ppm-8 wt % ammonium salt, 0.1 ppm-5 wt % corrosion inhibitor, 34-99.5 wt % solvent, 0-8 wt % fluoride source and 0-10% weak acid; (b) diluting solvent that is added to the concentrated composition in a weight ratio of 100:1 to 1:100 of the concentrated composition to solvent to make a diluted composition; and (c) oxidizing agent combined with the diluted composition in a weight ratio of 99:1 to 1:99

In another aspect, alone or in any combination with any, some or all of the other aspects, the invention provides a system for selectively removing titanium nitride from a surface of a microelectronic device, comprising: the semiconductor device comprising the titanium nitride and a second material selected from Cu, Co, low-k dielectric material and combinations thereof, and any of the compositions of this invention for selectively removing the titanium nitride, wherein the titanium nitride and the second material are in direct contact with the composition.

In another aspect, alone or in any combination with any, some or all of the other aspects is provided a method of selectively removing titanium nitride comprising the steps of: providing a semiconductor device comprising the titanium nitride and a second material selected from Cu, Co, low-k dielectric material; contacting the semiconductor device with any of the compositions disclosed herein; and selectively removing the titanium nitride.

In another aspect, alone or in any combination with any, some or all of the other aspects, is provided a method comprising the steps of: preparing a concentrated composition comprising a solvent, an etchant agent, an ammonium salt, a metal corrosion inhibitor and optional oxidizing stabilizer, optional fluoride, and optional weak acid; diluting the concentrated composition with solvent to form a diluted composition; and mixing the diluted composition with an oxidizing agent to form a cleaning composition and the method may further comprise the step of contacting a semiconductor device with the cleaning composition, which results in the selective removal of titanium nitride from the semiconductor device.

In another aspect, alone or in any combination with any, some or all of the other aspects is provided a cleaning composition for selectively removing at least one of titanium nitride and photoresist etch residue material from the surface of a microelectronic device having same thereon, said cleaning composition comprising (a) concentrated composition comprising at least 5 wt percent of a solvent, at least 0.1 wt percent of an etchant agent, at least 0.01 wt percent of an ammonium salt, at least 50 ppm of an oxidizing stabilizer, and at least 0.1 ppm of a metal corrosion inhibitor; and (b) an oxidizing agent that is at least 1 wt percent of the cleaning composition.

Additional aspects are described herein that may be combined with the aspects above. Cleaning compositions, methods and systems are disclosed herein that partially or totally remove the PVD TiN hard mask and/or any residues from the plasma etch process. Additionally, some of the cleaning compositions, methods and systems of this invention provide the benefit of leaving no or limited residues on the device or wafer after contacting the cleaning composition. Reduced or limited residues may eliminate the need for subsequent cleaning with chemicals, such as with dilute HF, in the method of this invention. After contact with the cleaning composition, wafers or devices may be rinsed with chemical-free DIW to remove any residue that would remain on the wafer surface and dried. In some embodiments, the method may be free of the step of contacting the wafer with dilute HF after the step of contacting the wafer or device with the cleaning compositions of this invention.

DETAILED DESCRIPTION OF THE INVENTION

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted, but also include the partially closed or closed terms of "consisting essentially of" and "consisting of". Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. All percentages are weight percentages and all weight percentages are based on the total weight of the composition (prior to any optional concentration and/or dilution thereof). Any reference to "one or more" includes "two or more" and "three or more" and so on.

Preferred embodiments of this invention are described herein. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

For ease of reference, "microelectronic device" corresponds to semiconductor substrates or wafers, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" or "semiconductor substrate" is not meant to be limiting in any way and includes any substrate that will eventually become a microelectronic device or microelectronic assembly.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Free of" means less than 1 ppb. As used herein, "about" is intended to correspond to ±5% of the stated value.

Disclosed herein is a cleaning composition of chemical strippers for TiN hard mask removal, in some embodiments for, physical vapor deposition (PVD) TiN hard mask removal or etching ("removal" and "etching" are used interchangeably herein) on integrated circuit bearing wafers. A PVD TiN hard mask is used to provide fine feature control during plasma etching. Suitable stripper/cleaning chemistries must be able to pullback or totally remove the PVD TiN hard mask as well as any residues from the plasma etch process.

The cleaning compositions (hard mask removers) disclosed herein preferably comprise an etchant agent (also referred to as a base), an oxidizing agent, an optional oxidizing stabilizer (also referred to as a chelator or chelating agent), an ammonium salt, a corrosion inhibitor, and a solvent. The cleaning compositions may comprise other optional additives such as fluoride source or weak acid. It is preferable that the pH of the cleaning composition be greater than 5.5, more preferably between 5.5 and 14, even more preferably between 6 and 13. In other embodiments the pH of the cleaning composition may be greater than 7, or between 7 and 14, or between 7 and 12, or between 8 and 11. The cleaning composition is preferably free of dimethyl sulfoxide and/or tetramethylammonium hydroxide.

The compositions of this invention include three compositions: the "cleaning composition", the "diluted composition" and the "concentrated composition". The "cleaning composition" is prepared with all of the components identified above and is used to clean a substrate or device. A "concentrated composition" may be made prior to making the cleaning composition. The "concentrated composition" comprises the same components of the cleaning composition, except the concentrated composition does not at a minimum comprise the oxidizing agent. The concentrated composition may also not comprise all or some of the solvent that will be present in the cleaning composition. The concentrated composition if diluted with the addition of solvent (that may be water) will make what is referred to as the "diluted composition". The cleaning composition may be made by adding oxidizing agent or an oxidizing agent in a solvent solution to the diluted composition. In alternative embodiments, the cleaning composition may be made by adding oxidizing agent or an oxidizing agent in a solvent solution to the concentrated composition. The term "oxidizing agent" will refer to both the neat oxidizing agent and/or the oxidizing agent in a solvent. In one embodiment the oxidizing agent is added to the concentrated composition in a single step to form the cleaning composition of this invention. In alternative embodiments, the cleaning composition may be formed in a multi-step process in which a "diluted composition" is formed in a by adding solvent to the concentrated composition, followed by another step in which the oxidizing agent (neat or in a solvent solution) is added to the diluted composition. In yet other embodiments, if desired, one or more additional dilution steps may be used, to add solvent (the same or different solvents) in each step, to make the cleaning composition of this invention. In yet other embodiments, one or more dilution steps may follow the addition of the oxidizing agent to the concentrated composition or a highly diluted oxidizing agent may be added in a single step to the concentrated composition to make the cleaning compositions of the invention. The preferred two step method of making the cleaning composition from the concentrated composition will be described below; however, the other methods, just described, of making the cleaning composition are contemplated by this invention.

Typically, although not limited thereto, the solvent added to the concentrated composition (to make the diluted composition) is water. Typically, although not limited thereto the oxidizing agent is added to the concentrated composition or the diluted composition in an aqueous solution to make the cleaning composition of this invention. Selling or shipping a concentrated composition, that is diluted on-site with solvent (water), and/or the oxidizing agent is also added on-site (preferably at the point of use), is contemplated by this invention.

The concentrated composition may be diluted (or not) with solvent (de-ionized water), preferably at a weight ratio of 100:1 to 1:100 (concentrated composition:solvent (water)), more preferably, if diluted with solvent, from 30:1-1:30 (concentrated composition:solvent (water)), and most preferably, if diluted with solvent, from 1:1-1:20 (concentrated composition:solvent (water)) to produce the diluted composition to which the oxidizing agent is added in a separate step to make the cleaning composition. Prior to use, the diluted composition (or concentrated composition) is mixed with the oxidizing agent. Preferably the diluted composition (or concentrated composition) is mixed with the oxidizing agent at a weight ratio of 99:1 to 1:99 to make the cleaning composition of this invention. More preferably, the diluted composition (or concentrated composition) is mixed with the oxidizing agent at a weight ratio from 5:95 to 95:5 to make the cleaning composition of this invention. Most preferably, the diluted composition (or concentrated composition) is mixed with the oxidizing agent at a weight ratio from 5:95 to 80:20 to make the cleaning composition of this invention. In many embodiments, the oxidizing agent is a commercially available 30% $H_2O_2$ solution. The wafer device may then be exposed to the cleaning composition of this invention having the oxidizing agent therein for a desired amount of time, at a desired temperature. Subsequently, the wafer or other device is removed from the cleaning composition of this invention, rinsed in de-ionized water, and dried by exposure to nitrogen gas. It is contemplated that the cleaning compositions described herein are used in a "drain mode" process, in which the cleaning composition is used once, then is removed from the system by being directed to waste. Note in some embodiments, the oxidizing stabilizer is an optional component. The oxidizing stabilizer may have limited impact on the stability of the cleaning composition, particularly when used in the drain mode, and therefore in some embodiments, the composition(s) may optionally comprise or be free of an oxidizing stabilizer. Optionally, the cleaning compositions described herein may be utilized in a circulation mode system, where after use on a wafer or device, the composition is recycled for treatment of additional wafers or devices. In a circulation mode system, the components of the cleaning composition other than the solvent and oxidizing agent are preferably provided in higher concentrations than is needed in a drain mode system.

Etchant Agent

The etchant agent to be used in the composition may include but are not limited to tetraethylammonium hydroxide (TEAH), trimethylphenylammonium hydroxide (TMPAH), tetramethylammonium hydroxide (TMAH), tetrapropylammonium hydroxide (TPAH), tetrabutylammonium hydroxide (TBAH), choline hydroxide, ammonium hydroxide, benzyltriethylammonium hydroxide (BTEAH), tetrabutylphosphonium hydroxide (TBPH), (2-hydroxyethyl) trimethylammonium hydroxide, (2-hydroxyethyl) triethylammonium hydroxide, (2-hydroxyethyl) tripropylammonium hydroxide, (1-hydroxypropyl) trimethylammonium hydroxide, ethyltrimethylammonium, hydroxide, diethyldimethylammonium hydroxide (DEDMAH), dimethyldipropylammonium hydroxide, diethylenetriamine, monoethanolamine, 1,8-diazabicyclo(5.4.0)undec-7-ene, triethanolamine, 1-amino-2-propanol, 3-morpholinopropylamine, 1-(2-aminoethyl)piperazine, N-(2-hydroxyethyl)-ethylenediamine, or 2-(methylamino)ethanol and combinations thereof. The etchant agent may comprise mixed tetraalkylammonium hydroxide, wherein the alkylammonium cation contains alkyl groups of at least two different chain lengths. The etchant agent may comprise tetraethylammonium hydroxide (TEAH), choline hydroxide, tetramethylammonium hydroxide (TMAH), trimethylphenylammonium hydroxide (TMPAH), tetrabutylammonium hydroxide (TBAH), ethyltrimethylammonium, hydroxide, ammonium hydroxide, 1,8-diazabicyclo(5.4.0)undec-7-ene, 1-(2-aminoethyl)piperazine and combinations thereof. The preferred etchant agent may comprise tetraethylammonium hydroxide (TEAH), choline hydroxide, tetramethylammonium hydroxide (TMAH), trimethylphenylammonium hydroxide (TMPAH), tetrabutylammonium hydroxide (TBAH), 1,8-diazabicyclo(5.4.0)undec-7-ene.

The etchant agent preferably comprises 0.1-30 wt percent, more preferably 0.5-25 wt percent, and most preferably 1-20 wt percent of the concentrated composition.

Corrosion Inhibitor

The cleaning composition preferably includes a corrosion inhibitor to minimize loss of metal substrates such as copper and cobalt. Examples of corrosion inhibitors that may be used in the composition include 1,2,4-triazole (TAZ), benzotriazole (BZT), methyl-1H-benzotriazole, and tolyltriazole (TTL), 2-aminobenthothiazole, benzimidazole, 2-mercapto-5-methylbenzimidaole, 8-hydroxyquinoline, 1-thioglycerol, ascorbic acid, pyrazole, sugar alcohols, such as, sorbitol, maltitol and mannitol, theophylline, caffeine, polyethylene glycol MW 400 (PEG400), poly(propylene glycol), triton X-100, surfynol-485 from Evonik, uric acid, decanoic acid, 11-mercaptoundecanoic acid (MUDA), hexadecyl trimethylammonium p-toluene sulfonate (CTAT), hexylamine, and aniline type corrosion inhibitors, such as, 3,4-diaminotoluene, p-anisidine, 4-Methyl-o-phenylenediamine, 4-Nitroaniline, 4-carboxy-o-phenylenediamine, 8-Aminoquinoline, 5-Amino-2-benzimidazolinone and N,N-dimethyl-p-phenylenediamine, and combinations of any of the foregoing thereof. The preferred weight percentage of corrosion inhibitor in the concentrated composition will depend on the specific corrosion inhibitor being used. For example, if the corrosion inhibitor is theophylline, it preferably comprises >0-15 wt percent, more preferably 1 ppm-5 wt percent, and most preferably 5 ppm-5 wt percent of the concentrated composition.

The corrosion inhibitor may comprise sorbitol, maltitol, mannitol, theophylline, tolyltriazole (TTL), 11-mercaptoundecanoic acid (MUDA), polyethylene glycol MW 400 (PEG400), triton X-100, 3,4-diaminotoluene, p-anisidine, 4-methyl-o-phenylenediamine, 4-Nitroaniline, 4-carboxy-o-phenylenediamine, 8-aminoquinoline, and 5-amino-2-benzimidazolinone. In some embodiments, the corrosion inhibitor may comprise sorbitol, maltitol, mannitol, theophylline, tolyltriazole (TTL), 11-mercaptoundecanoic acid (MUDA), triton X-100, 3,4-diaminotoluene, p-anisidine, 4-methyl-o-phenylenediamine, 4-Nitroaniline, 4-carboxy-o-phenylenediamine, 8-aminoquinoline, and 5-amino-2-benzimidazolinone. The corrosion inhibitor may comprise theophylline, sorbitol, maltitol, tolyltriazole (TTL), 3,4-diaminotoluene, 11-mercaptoundecanoic acid (MUDA), polyethylene glycol MW 400 (PEG400), p-anisidine, 4-methyl-o-phenylenediamine, 4-Nitroaniline, 4-carboxy-o-phenylenediamine, 8-aminoquinoline, and 5-amino-2-benzimidazolinone. In some embodiments, the preferred corrosion inhibitor comprises theophylline, sorbitol, maltitol, tolyltriazole (TTL), 3,4-diaminotoluene,11-mercaptoundecanoic acid (MUDA), p-anisidine, 4-methyl-o-phenylenediamine, 4-Nitroaniline, 4-carboxy-o-phenylenediamine, 8-aminoquinoline, and 5-amino-2-benzimidazolinone. The concentrated composition may comprise corrosion inhibitors in any weight percent within a range having start and end points selected from the following group of numbers: 0, 0.00001, 0.0001, 0.001, 0.01, 0.1, 1, 1.5, 2, 3, 4, 5, 6, 7, 8, 9, 10, 12, 14 and 15. For example, the corrosion inhibitor may be present in the concentrated composition from 0.00001 to 15 wt percent, or from 0.1 to 10 wt percent, or from 1 to 8 wt percent of the concentrated composition.

In some embodiments, the compositions may be free of any of the corrosion inhibitors listed above in any combination.

Ammonium Salt

The cleaning composition of the invention comprises one or more ammonium salts. Examples of useful ammonium salts may include but are not limited to ammonium salts of weak acids and include triammonium citrate, ammonium acetate, ammonium malonate, ammonium adipate, ammonium lactate, ammonium iminodiacetate, ammonium chloride, ammonium bromide, ammonium fluoride, ammonium bifluoride, ammonium sulfate, ammonium oxalate, ammonium lactate, ammonium tartrate, ammonium citrate tribasic, ammonium acetate, ammonium carbamate, ammonium carbonate, ammonium benzoate, tetraammonium EDTA, ethylenediaminetetraacetic acid diammonium salt, ammonium succinate, ammonium formate, ammonium 1-H-pyrazole-3-carboxylate, and combinations thereof. The ammonium salt preferably comprises 100 ppm-8 wt percent, more preferably 500 ppm-8 wt percent, and most preferably 0.1-5 wt percent of the concentrated composition. The concentrated composition may comprise one or more ammonium salts in any weight percent within a range having start and end points selected from the following group of numbers: 0, 0.00001, 0.00005, 0.0001, 0.0005, 0.001, 0.005, 0.01, 0.05, 0.1, 0.5, 1, 1.5, 2, 3, 4, 5, 6, 7, 8, 9, 10, 12, 14, 15, 16, 17, 18, 19 and 20. For example, the ammonium salts may be present in the composition from 0.0001 to 15 wt percent, or from 0.1 to 10 wt percent, or from 1 to 8 wt percent of the concentrated composition.

The ammonium salt may be selected from ammonium citrate tribasic, ammonium acetate, tetraammonium EDTA, ethylenediaminetetraacetic acid diammonium salt, ammonium chloride, ammonium bromide, ammonium fluoride, or ammonium bifluoride or mixtures thereof. The preferred ammonium salt may be selected from ammonium citrate tribasic, ethylenediaminetetraacetic acid diammonium salt, and ammonium fluoride.

In some embodiments, the composition may be free of any of the ammonium salts listed above in any combination.

Oxidizing Agent

The cleaning compositions employ a peroxide for example, hydrogen peroxide, as an oxidizing agent for TiN hard mask removal. The peroxide to be used in the composition may include but is not limited to hydroxide peroxide, ammonium persulfate, peracetic acid, peroxybenzoic acid, oxone ($2KHSO_5 \cdot KHSO_4 \cdot K_2SO_4$), n-methylmorpholine oxide (NMMO or NMO), benzoyl peroxide, tetrabutylammonium peroxymonosulfate, ferric chloride, permanganate peroxoborate, periodic acid, iodic acid, vanadium (V) oxide, vanadium(IV, V) oxide, ammonium vanadate, perchlorate, persulfate, ammonium peroxydisulfate, per acetic acid, urea hydroperoxide, nitric acid ($HNO_3$), ammonium hypochlorite ($NH_4ClO$), ammonium tungstate (($NH_4)_{10}H_2(W_2O_7)$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), tetramethylammonium chlorite (($N(CH_3)_4)ClO_2$), tetramethylammionium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$), (($CO(NH_2)_2)H_2O_2$), peracetic acid (CH(CO)OOH), and combinations thereof. The oxidizing agent preferably comprises 1-30 wt percent, more preferably 5-30 wt percent, and most preferably 6-27 wt percent of the cleaning composition based on neat component.

The oxidizing agent may comprise hydroxide peroxide, ammonium persulfate, n-methylmorpholine oxide (NMMO or NMO), benzoyl peroxide, peracetic acid and combinations thereof. The preferred oxidizing agent comprises hydrogen peroxide.

The compositions may be free of any of the above-listed oxidizing agents in any combination.

Oxidizing Stabilizer/Chelator (Optional)

The compositions of the present invention may also include an oxidizing stabilizer, such as a metal chelating agent. The metal chelating agent stabilizes the composition by complexing with trace metals that may accumulate in the composition during use of the composition, thereby preventing the trace metals from decomposing the oxidizer of the composition. For example, free trace metal cations, such as copper ions, catalyze the decomposition of hydrogen peroxide into oxygen and water, which will accelerate the reduction of etching and cleaning performance of the composition over time. Examples of suitable chelating agents include, but are not limited to glycine, serine, proline, leucine, alanine, asparagine, aspartic acid, glutamine, glutamic acid, valine, lysine, cystine, nitrilotriacetic acid (NTA), iminodiacetic acid (IDA), ethylenediaminetetraacetic acid (EDTA), (1,2-cyclohexylenedinitrilo)tetraacetic acid (CDTA), uric acid, tetraglyme, diethylenetriamine pentaacetic acid (DTPA), propylenediamine-N,N,N', N'-tetraacetic acid, ethylendiamine disuccinic acid (EDDS), sulfanilamide, 1,4,7,10-tetraazacyclododecane-1,4,7,10 tetraacetic acid; ethylene glycol tetraacetic acid (EGTA); 1,2-bis(o-aminophenoxy)ethane-N,N,N',N'-tetraacetic acid; N-2-bis(carboxymethyl)aminoethyl-N-(2-hydroxy ethyl) glycine (HEDTA); and ethylenediamine-N,N'-bis(2-hydroxyphenylacetic acid) (EDDHA), 1,3-diaminopropane-N, N,N',N'-tetraacetic acid, gluconic acid, N,N,N',N'-ethylenediaminetetrakis(methylenephosphonic acid) (EDTMP), diethylenetriamine penta(methylene phosphonic acid) (ETDMP), nitrilotris(methylene)triphosphonic acid (ATMP), tartaric acid, 3,4-dihydroxybenzoic acid, Salicylic acid, 8-Hydroxyquinoline (8-HQ), etidronic acid (HEDP), 1,3-propanediamine-N,N,N',N'-tetraacetic acid, triethylenetetramine hexaacetic acid (TTNA), picolinic acid and combinations thereof. The oxidizing stabilizer preferably comprises 0-5 wt percent, more preferably 50 ppm-3 wt percent, and most preferably 100 ppm-2 wt percent of the concentrated composition. In alternative embodiments, the optional oxidizing stabilizer may be present in the concentrated composition in an amount within a weight percent range having any of the following start and end points: 0, 0.000001, 0.000005, 0.00001, 0.00005, 0.0001, 0.0005, 0.001, 0.005, 0.01, 0.05, 0.1, 0.5, 1, 2, 3, 4, 5, 6, 7, 8, 9 and 10. For examples the concentrated composition may comprise from 0.0001 to 8 wt percent, or from 0.001 to about 5 wt percent or from 0.01 to 2 wt percent oxidizing stabilizer In some embodiments, the oxidizing stabilizer/chelator is selected from glycine, serine, proline, leucine, alanine, asparagine, aspartic acid, glutamine, glutamic acid, valine, lysine, and cystine, nitrilotriacetic acid (NTA), iminodiacetic acid (IDA), ethylenediaminetetraacetic acid (EDTA), (1,2-cyclohexylenedinitrilo)tetraacetic acid (CDTA), gluconic acid, N-2-bis(carboxymethyl)aminoethyl-N-(2-hydroxy ethyl)glycine (HEDTA), nitrilotris(methylene)triphosphonic acid (ATMP), tartaric acid, 3,4-dihydroxybenzoic acid, salicylic acid, 8-hydroxyquinoline (8-HQ), etidronic acid (HEDP). The preferred oxidizing stabilizer/chelator comprises glutamic acid, ethylenediaminetetraacetic acid (EDTA), gluconic acid and N-2-bis(carboxymethyl)aminoethyl-N-(2-hydroxy ethyl) glycine (HEDTA).

In some embodiments, the oxidizing stabilizer is an optional component, or the composition may be free of oxidizing stabilizer. For example, when the cleaning composition is used in the drain mode, the oxidizing stabilizer, if present in the cleaning composition, may have minimal impact on the stability of cleaning composition in drain mode and therefore the cleaning composition may not comprise the oxidizing stabilizer. The compositions, therefore, may be free of any of the above-listed oxidizing stabilizers in any combination.

Solvent

The compositions of present invention may be fully aqueous, i.e., the solvent is water; or optionally additional non-aqueous solvents may be added to enhance TiN etch performance or improve selectivity. The water may be deionized water (DI water), purified water, or distilled water. Examples of optional non-aqueous solvents that may optionally be used in the composition include, but are not limited to, dimethyl sufoxide (DMSO), dimethyl sulfone (DMSO2), sulfolane ((CH2)4SO2), n-methylpyrrolidone, dipropyleneglycolmethylether, tripropyleneglycolmethyl ether, and combinations thereof. The solvent preferably comprises 5-95, or 20-95, or 10-90, or 45-90, or 20-85, or 65-90 or 60-99.5 wt percent of the concentrated composition. In other embodiments, the weight percent of the solvent present in the concentrated composition of the invention may be any weight percent range having the start and end points in the following list: 5, 10, 15, 20, 25, 30, 34, 35, 40, 45, 46, 50, 55, 60, 65, 70, 75, 80, 85, 90, 95 and 99.5. In some embodiments, the compositions of this invention are free of any or all of the above-listed or any or all non-aqueous solvents. The preferred solvent is water.

Optional Components & Additives

It is contemplated that the composition described herein may comprise a fluoride source to help boost TiN etch rate or cleaning. Useful fluoride sources include $H_2ZrF_6$, $H_2TiF_6$, $HPF_6$, HF, ammonium fluoride, tetrafluoroboric acid, hexafluorosilicic acid, tetrabutylammonium tetrafluoroborate (TBA-BF$_4$), ammonium hexafluorosilicate, ammonium hexafluorotitanate, ammonium bifluoride ($NH_4HF_2$), and tetramethylammonium fluoride (TMAF), and combinations thereof. The fluoride source may comprise HF, ammonium fluoride, ammonium bifluoride, or ammonium hexafluorosilicate. Alternatively, the preferred fluoride source may be ammonium fluoride, or ammonium bifluoride, The fluoride source may be present in an amount of 0-8 wt percent, more preferably 100 ppm-5 wt %, 500 ppm-8 wt %, 200 ppm-2 wt % and most preferably 0.1-5% in the concentrated composition. In alternative embodiments, the fluoride source may be present in the concentrated composition within any weight percent range selected from the following start and end points: 0, 0.00001, 0.00005, 0.0001, 0.0005, 0.001, 0.005, 0.01, 0.05, 0.1, 0.5, 1, 2, 3, 4, 5, 6, 7, 8, 9 and 10.

In some embodiments, the compositions are free of added fluoride sources or any of the above-listed fluoride sources in any combination.

A weak acid may optionally be included in the composition in order to maintain the pH of the composition within desired ranges discussed above. Examples of suitable weak acids include, but are not limited to, carboxylic acids including citric acid, oxalic acid, malonic acid, lactic acid, adipic acid, acetic acid, iminodiacetic acid, methanesulfonic acid, p-toluenesulfonic acid and combinations thereof. If present in the composition, the weak acids are preferably provided in an amount of 0-10 wt percent, more preferably 500 ppm-5 wt percent, the most preferably 0.1-3 wt percent of the concentrated composition. In some embodiments, the compositions are free of any of the above-listed weak acids in any combination. An ammonium salt buffer may optionally be added, or, arise through the combination of the ammonium hydroxide present as the etchant agent in the compositions of this invention or the alkylammonium hydroxides described below and conjugate acids of the salts mentioned.

In some embodiments, the compositions of this invention will be free of any of the following materials in any combination: abrasive particles, metals, metal hydroxides, sulfur-containing compounds, chlorine-containing compounds, inorganic acids, nitrites, nitrides, halide-containing compounds excluding or including fluorine-containing compounds, potassium-containing compounds, manganese-containing compounds.

In some embodiments of the invention, the concentrated compositions (100 wt %) may comprise, based on neat components, one of each of the following ranges of weight percent for each of the components, if present, in any combination:

| Component | Preferred weight percent | More preferred weight percent | The most preferred weight percent |
|---|---|---|---|
| Etchant Agent | 0.1-30% | 0.5-25% | 1-20% |
| Oxidizing Agent | 0 | 0 | 0 |
| Optional Oxidizing Stabilizer/Chelator | 0-5% | 50 ppm-3% | 100 ppm-2% |
| Ammonium Salt | 100 ppm-8% | 500 ppm-8% | 0.1-5% |
| Corrosion Inhibitor | 0.1 ppm-5% | 1 ppm-5% | 5 ppm-5% |
| Solvent | 34-99.5% | 46-99% | 60-98% |
| Optional fluoride source | 0-8% | 500 ppm-8% | 0.1-5% |
| Optional weak acid | 0-10% | 500 ppm-5% | 0.1-3% |

For example, the concentrated composition may comprise 0.1-30 wt % etchant agent, 0-5 wt % oxidizing stabilizer/chelator, 100 ppm-8 wt % ammonium salt, 0.1 ppm-5 wt % corrosion inhibitor, 34-99.5 wt % solvent, and 0-8 wt % fluoride source. Alternatively, the concentrated composition may comprise 0.5-25 wt % etchant agent, 50 ppm-3 wt % oxidizing stabilizer/chelator, 500 ppm-8 wt % ammonium salt, 1 ppm-5 wt % corrosion inhibitor, 46-99 wt % solvent, and 500 ppm-8 wt % fluoride source. Alternatively, the concentrated composition may comprise 1-20 wt % etchant agent, 100 ppm-2 wt % oxidizing stabilizer/chelator, 0.1-5 wt % ammonium salt, 5 ppm-5 wt % corrosion inhibitor, 60-98 wt % solvent, 0.1-5 wt % fluoride source. Alternatively, the concentrated composition may comprise 0.1-30 wt % etchant agent, 50 ppm-3 wt % oxidizing stabilizer/chelator, 0.1-5% ammonium salt, 0.1 ppm-5 wt % corrosion inhibitor, 46%-99% solvent, and 0-8% fluoride source. Alternatively, the concentrated composition may comprise 0.5-25 wt % etchant agent, 50 ppm-3 wt % oxidizing stabilizer/chelator, 100 ppm-8 wt % ammonium salt, 1 ppm-5 wt % corrosion inhibitor, 34%-99.5 wt % solvent, and 0-8 wt % fluoride source. Alternatively, the concentrated composition may comprise 1-20 wt % etchant agent, 50 ppm-3 wt % oxidizing stabilizer/chelator, 0.1-5 wt % ammonium salt, 5 ppm-5 wt % corrosion inhibitor, 46%-99 wt solvent, and 500 ppm-8 wt % fluoride source and 0.1-3 wt % weak acid. The just-described compositions may comprise other optional components.

In some embodiments of the invention, the diluted compositions (100 wt %) may comprise, based on neat components, one of each of the following ranges of weight percent for each of the components, if present, in any combination:

| Component | Preferred weight percent | More preferred weight percent | The most preferred weight percent |
|---|---|---|---|
| Etchant Agent | 0.01-10% | 0.05-9% | 0.1-7% |
| Oxidizing Agent | 0 | 0 | 0 |
| Optional Oxidizing Stabilizer/Chelator | 0-2% | 5 ppm-1.2% | 10 ppm-1% |
| Ammonium Salt | 10 ppm-3% | 50 ppm-3% | 100 ppm-3% |
| Corrosion Inhibitor | 0-2% | 0.1 ppm-2% | 0.5 ppm-2% |
| Solvent | 79-99.9% | 80-99.9% | 84-99.9% |
| Optional fluoride source | 0-2% | 50 ppm-2% | 100 ppm-2% |
| Optional weak acid | 0-2% | 50 ppm-2% | 100 ppm-1% |

For example, the diluted composition may comprise 0.01-10 wt % etchant agent, 0-2 wt % oxidizing stabilizer/chelator, 10 ppm-3 wt % ammonium salt, 0-2 wt % corrosion Inhibitors, 79-99.9 wt % solvent, and 0-2 wt % fluoride source. Alternatively, the diluted composition may comprise 0.05-9 wt % etchant agent, 5 ppm-1.2 wt % oxidizing stabilizer/chelator, 50 ppm3 wt % ammonium salt, 0.1 ppm-2 wt % corrosion Inhibitors, 80-99.9 wt % solvent, and 50 ppm-2 wt % fluoride source. Alternatively, the diluted composition may comprise 0.1-7 wt % etchant agent, 10 ppm-1 wt % oxidizing stabilizer/chelator, 100 ppm-3 wt % ammonium salt, 0.5 ppm-2 wt % corrosion inhibitor, 84-99.9 wt % solvent, and 100 ppm-1 wt % fluoride source. Alternatively, the diluted composition may comprise 0.01-10 wt % etchant agent, 0-2 wt % oxidizing stabilizer/chelator, 50 ppm-3 wt % ammonium salt, 0.1 ppm-2 wt % corrosion inhibitor, 79-99.9 wt % solvent, and 0-2 wt % fluoride source and 0-2 wt % weak acid. Alternatively, the diluted composition may comprise 0.05-9 wt % etchant agent, 5 ppm-1.2 wt % oxidizing stabilizer/chelator, 10 ppm-3 wt % ammonium salt, 0.1 ppm-2 wt % corrosion inhibitor, 80-99.9 wt % solvent, and 0-2 wt % fluoride source. Alternatively, the diluted composition may comprise 0.1-7 wt % etchant agent, 10 ppm-1 wt % oxidizing stabilizer/chelator, 10 ppm-3 wt % ammonium salt, 0.1 ppm-2 wt % corrosion inhibitor, 84-99.9 wt % solvent, and 50 ppm-2 wt % fluoride source and 100 ppm-1 wt % weak acid. The just-described compositions may comprise other optional components.

In some embodiments of the invention, the cleaning compositions (100 wt %) having the oxidizing agent therein (the cleaning compositions of this invention) may comprise, based on neat components, one of each of the following ranges of weight percent for each of the components, if present, in any combination:

| Component | Preferred weight percent | More preferred weight percent | The most preferred weight percent |
|---|---|---|---|
| Etchant Agent | 50 ppm-15% | 70 ppm-10% | 100 ppm-8% |
| Oxidizing Agent | 1-30% | 5%-30% | 6%-27% |
| Optional Oxidizing Stabilizer/Chelator | 0.1 ppm-2% | 0.5 ppm-1% | 1 ppm-1% |
| Ammonium Salt | 10 ppm-3% | 20 ppm-2% | 40 ppm-1% |
| Corrosion Inhibitor | 0.01 ppm-3% | 0.05 ppm-2% | 0.08 ppm-1% |
| Solvent | 45%-98% | 53%-95% | 61%-95% |
| Optional fluoride source | 0-1% | 0.5 ppm-1% | 1 ppm-0.5% |
| Optional weak acid | 0-1% | 20 ppm-0.5% | 40 ppm-0.3% |

For example, the cleaning composition may comprise 50 ppm-15 wt % etchant agent, 1-30 wt % oxidizing agent, 0.1 ppm-2 wt % oxidizing stabilizer/chelator, 10 ppm-3 wt % ammonium salt, 0.01 ppm-3 wt % corrosion inhibitor, 45-98 wt % solvent, and 0-1 wt % fluoride source. Alternatively, the cleaning composition may comprise 70 ppm-10 wt % etchant agent, 5-30 wt % oxidizing agent, 0.5 ppm-1 wt % oxidizing stabilizer/chelator, 20 ppm-2 wt % ammonium salt, 0.05 ppm-2 wt % corrosion inhibitor, 53-95 wt % solvent, and 0.5 ppm-1 wt % fluoride source. Alternatively, the cleaning composition may comprise 100 ppm-8 wt % etchant agent, 6-27 wt % oxidizing agent, 1 ppm-1 wt % oxidizing stabilizer/chelator, 40 ppm-1 wt % ammonium salt, 0.08 ppm-1 wt % corrosion inhibitor, 61-95 wt % solvent, and 1 ppm-0.5 wt % fluoride source. Alternatively, the cleaning composition may comprise 100 ppm-8 wt % etchant agent, 6-27 wt % oxidizing agent, 0.1 ppm-2 wt % oxidizing stabilizer/chelator, 20 ppm-2 wt % ammonium salt, 0.01 ppm-3 wt % corrosion inhibitor, 45-98 wt % solvent, 0-1 wt % fluoride source and 40 ppm-0.3 wt % weak acid. Alternatively, the cleaning composition may comprise 70 ppm-10 wt % etchant agent, 1-30 wt % oxidizing agent, 0.1 ppm-2 wt % oxidizing stabilizer/chelator, 20 ppm-2 wt % ammonium salt, 0.08 ppm-1 wt % corrosion inhibitor, 45-98 wt % solvent, 0-1 wt % fluoride source, and 40 ppm-0.3 wt % weak acid. Alternatively, the cleaning composition may comprise 50 ppm-15 wt % etchant agent, 5-30 wt % oxidizing agent, 1 ppm-1 wt % oxidizing stabilizer/chelator, 10 ppm-3 wt % ammonium salt, 0.01 ppm-3 wt % corrosion inhibitor, 53-95 wt % solvent, 0.5 ppm-1 wt % fluoride source, and 0-1 wt % weak acid. The just-described compositions may comprise other optional components.

The compositions disclosed herein were developed based on blanket and patterned wafer studies, which have some distinct features:
1. High rates of PVD TiN etch are observed at moderate temperatures ranging from room temperature to 70° C., where the etch rate of PVD TiN is tunable, such as by varying the temperature or dilution ratio with hydrogen peroxide for the operation.
2. The composition is selective for the removal of mask agents such as PVD TiN, and is compatible with materials containing copper, cobalt, tetraethylorthosilicate (TEOS), or other low-k dielectrics, as the compositions have relatively low etch rates for these materials.
3. Plasma etch residues are determined to be readily removed from patterned wafers upon exposure to the formulations described herein, thus obviating the need for additional post-processing cleaning by exposing the etched devices/substrates to dilute hydrofluoric acid.

EXAMPLES

The following examples are provided for the purpose of further illustrating the embodiments disclosed herein but should not be interpreted as limiting. Unless otherwise noted, all compositional amounts are expressed by weight percent (wt percent).

Composition and Beaker Test Procedure

The general procedure for preparation and testing of various embodiments of the formulations was as follows. Each chemical formulation was prepared according to the corresponding amounts provided in the Tables below without the oxidizing agent added. Each prepared chemical formulation (concentrated composition) was then diluted 1:10 parts by weight in de-ionized water (DIW), to make the diluted composition for each example. Each of the diluted composition was then mixed by weight with the oxidizing agent (for example hydrogen peroxide, 30 wt percent solution) in the amounts specified in the examples. For instance, in Example 1, the condition D1H3, the D1 indicates the 1:10 dilution of the concentrated composition with water to form the diluted composition by weight and the H3 indicates a 7:3 mixture of 7 parts by weight of the diluted composition to 3 parts by weight of the 30% hydrogen peroxide solution to make the cleaning compositions, with results of testing the cleaning compositions (D1H3 examples) reported in Table 1. By comparison, for Example 2, the condition D1H4 indicates the ratio was 6:4, having 6 parts by weight of the diluted composition (1:10, concentrated composition:DIW) mixed with 4 parts by weight of 30% hydrogen peroxide solution to form the cleaning compositions. The results of testing the cleaning compositions (D1H4 examples) are reported in Table 2.

The mixtures of each of the diluted compositions (or concentrated composition) and the oxidizing agent (for hydrogen peroxide solution) to make the cleaning composition were provided at the testing temperatures in a bath, and wafers were dipped into the mixture for the time period indicated in the following examples. The wafers were then removed from the mixture and rinsed with de-ionized water for 3 minutes, at a rate of 800 standard cubic centimeters per minute (sccm). The rinsed wafers were then subjected to drying under nitrogen gas. The dried wafers could then be tested for etch rates.

The etch rates were measured at temperatures noted in the examples, between 35° C. to 70° C., and the time frame for etching PVD TiN was 0 to 5 minutes, and the time frame for etching cobalt (Co) and copper (Cu) was 0 to 15 minutes. The etch rates were measured using a ResMap 4-point probe resistivity meter. The etch rates were calculated by the thickness difference before and after treatment, divided by immersion time.

Composition Preparation

The ammonium salt was weighed and dissolved by DIW in a beaker. The etchant agent and metal corrosion inhibitor(s) were added slowly to the solution. Optionally, along with an optional oxidizing stabilizer, such as EDTA, or optional fluoride sources or weak acid, if needed. The solution was stirred to evenly dissolve solid reagents. As described above, each of the examples (the concentrated compositions) was diluted with DIW to make a diluted composition. The oxidizing agent was then added to the diluted composition (or concentrated composition) at the ratio specified. The solution was mixed homogeneously, and the mixture brought to the specified temperature.

Example 1: Varying Theophylline as a Corrosion Inhibitor

Example compositions 9B, 9M, 9C, and 9O, were prepared and adjusted to the temperatures of 40° C., as shown in Table 1. Table 1 shows those concentrated compositions having varying amounts of theophylline as the corrosion inhibitor, ranging from 1.09 to 1.91 wt percent. All concentrated compositions also contained, triammonium citrate, EDTA, TEAH and DIW. Each concentrated composition was prepared using the amounts in Table 1. The concentrated composition was diluted to make the diluted composition (1:10, concentrated composition:DIW) and then the diluted composition was admixed with a hydrogen peroxide (30% solution) at a ratio 7 parts diluted chemical to 3 parts 30% solution of hydrogen peroxide by weight. The pH for these formulations were determined to be between 9.13 and 9.19.

The etch rate for cobalt and copper when tested in these formulations were all less than 1.9 Angstrom (Å)/minute (min), and had a TiN etch rate greater than 29 Å/min. The best result was Example 9C, having 1.64 percent wt percent of theophylline, having the highest selectivity for removal of TiN mask material, relative to the removal of copper or cobalt material.

TABLE 1

| Components | 9B (40° C.) | 9M (40° C.) | 9C (40° C.) | 9O (40° C.) |
| --- | --- | --- | --- | --- |
| TAC | 1 | 1 | 1 | 1 |
| TEAH | 10.85 | 10.85 | 10.85 | 10.85 |
| EDTA | 0.0125 | 0.0125 | 0.0125 | 0.0125 |
| DIW | 87.05 | 86.78 | 86.50 | 86.23 |
| Theophylline | 1.09 | 1.36 | 1.64 | 1.91 |
| Total | 100 | 100 | 100 | 100 |
| Condition | D1H3 | D1H3 | D1H3 | D1H3 |
| E/R Co (15 min) | 1.31 | 1.62 | 1.15 | 1.58 |
| E/R Cu (15 min) | 1.83 | 1.9 | 1.69 | 1.7 |
| E/R TiN (5 min) | 29.77 | 39.55 | 43.49 | 40.65 |
| pH | 9.19 | 9.19 | 9.15 | 9.13 |

Example 2: Temperature Dependence of Theophylline and EDTA Formulation

Composition 9C was prepared for testing at 35° C., 40° C., and 45° C. as shown in Table 2. The concentrated composition had 1.64 wt percent of theophylline and contained, triammonium citrate, EDTA, TEAH and DIW. The diluted composition was admixed with hydrogen peroxide at a ratio 6 parts diluted composition to 4 parts 30% solution of hydrogen peroxide by weight.

TABLE 2

| Components | 9C (35° C.) | 9C (40° C.) | 9C (45° C.) |
| --- | --- | --- | --- |
| TAC | 1 | 1 | 1 |
| TEAH | 10.85 | 10.85 | 10.85 |
| EDTA | 0.0125 | 0.0125 | 0.0125 |
| DIW | 86.6 | 86.5 | 86.5 |
| Theophylline | 1.64 | 1.64 | 1.64 |
| Total | 100 | 100 | 100 |
| Condition | D1H4 | D1H4 | D1H4 |
| E/R Co (15 min) | 1.43 | 1.66 | 1.52 |
| E/R Cu (15 min) | 1.06 | 1.31 | 1.27 |
| E/R TiN (5 min) | 28.86 | 37.07 | 94.85 |
| pH | | 8.72 | |

As shown in Table 2, the etch rate for cobalt and copper when tested in these formulations were all less than 2.0 Å/min, and had a TiN etch rate greater than 25 Å/min. The pH for these formulations were determined to be 8.72. The best result was at an elevated temperature of 45° C., having a TiN etch rate of 94.85 Å/min, without a significant effect upon the etch rate for cobalt and copper.

Example 3: Testing PEG400 as a Corrosion Inhibitor, Varying Presence of EDTA as a Chelator Compositions 7E (with EDTA) and 7V (without EDTA) were prepared and tested at 40° C., as shown in Table 3. The diluted compositions were admixed with hydrogen peroxide at a ratio 6 parts diluted composition to 4 parts 30% solution of hydrogen peroxide by weight. The pH for these formulations were determined to be between 8.71 and 8.96.

TABLE 3

| Components | 7E (w EDTA) | 7V (w/o EDTA) |
|---|---|---|
| TAC | 0.8 | 0.8 |
| TEAH | 10.85 | 10.85 |
| EDTA | 0.35 | 0 |
| DIW | 86.91 | 87.26 |
| PEG 400 | 1.09 | 1.09 |
| Total | 100 | 100 |
| Condition | D1H4 | D1H4 |
| E/R Co @40° C., (15 min) | 1.54 | 0.38 |
| E/R Cu @40° C., (15 min) | 1.11 | 0.42 |
| E/R TiN @40° C., (5 min) | 50.01 | 54.33 |
| pH | 8.71 | 8.96 |

Both concentrated compositions contained the same amount of triammonium citrate (TAC), PEG 400, TEAH, but varied on the presence, or absence of, 0.35 wt percent of EDTA. The etch rate for the formulation having EDTA (7E), for each of cobalt and copper was determined to be less than 1.54 Å/min, and the etch rate of TiN was greater than 50 Å/min. The etch rate, for the formulation lacking EDTA (7V), of cobalt and copper, was determined to be less than 0.42 Å/min, and of TiN was greater than 54 Å/min. Thus, removing EDTA from the formulation with PEG 400 as a corrosion inhibitor was determined to reduce the copper and cobalt etch rate, but not have a significant effect upon the etch rate for TiN.

It is believed that the presence of the chelator EDTA in the formulation would also chelate the surface metal or metal oxide of the tested materials, and thus would affect the etch rate. Therefore, removing EDTA from the formulation would improve the formulations' compatibility with copper and cobalt, as evidenced by the reduced etch rate for those metals exposed to a formulation lacking the chelator EDTA. Although oxidizing stabilizer is absent, it had minimal impact on the stability of the cleaning composition in the drain mode.

Example 4: Testing Sorbitol as a Corrosion Inhibitor, Varying Temperature or Presence of EDTA as a Chelator/Oxidizer Stabilizer Compositions 9P, 11F and 39C were prepared and adjusted to a temperature of 40° C., or 45° C., as shown in Table 4. The diluted compositions were admixed with hydrogen peroxide at a ratio of 6 parts diluted composition to 4 parts 30% solution of hydrogen peroxide by weight. The pH for these formulations was tested at room temperature (22° C.) and were determined to be between 8.65 and 8.76.

TABLE 4

| Components | 9P (40° C.) | 11F (40° C.) | 11F (45° C.) | 39C (40° C.) |
|---|---|---|---|---|
| TAC | 1 | 1 | 1 | 1 |
| TEAH | 10.85 | 10.85 | 10.85 | 10.85 |
| EDTA | 0 | 0.0125 | 0.0125 | 0.02 |
| NH4F | 0 | 0 | 0 | 1.6 |
| DIW | 87.06 | 87.05 | 87.05 | 85.65 |
| Sorbitol | 1.09 | 1.09 | 1.09 | 1.3 |
| Total | 100 | 100 | 100 | 100 |
| Condition | D1H4 | D1H4 | D1H4 | D1H4 |
| E/R Co (15 min) | 1.14 | 1.25 | 1.48 | NA |
| E/R Cu (15 min) | 1.07 | 1.34 | 1.39 | 1.56 |
| E/R TiN (5 min) | 56.22 | 51.39 | 158.07 | 113.11 |
| pH (22° C.) | 8.76 | 8.65 | 8.65 | 8.84 |

Examples 9P 11F and 39C contained same amount of triammonium citrate (TAC), sorbitol, TEAH, but varied on the presence, or absence of, 0.0125 wt percent of EDTA at 40° C. Additionally, a second example of 11F the sorbitol formulation with EDTA, was prepared at an elevated temperature of 45° C. The etch rate for the formulation having EDTA (Example 11F), of cobalt and copper was determined to be less than 1.50 Å/min, and the TiN etch rate was greater than 51 Å/min at 40° C., and greater than 158 Å/min at 45° C. The etch rate for the 40° C. sorbitol formulation, without EDTA (Example 9P) of cobalt and copper, was determined to have lower Cu, Co etching rate than 11F, and had a TiN etch rate greater than 56 Å/min. Notably, the increase in temperature 40° C. to 45° C. had a large effect upon the TiN etch rate, increasing it from 51.39 Å/min to 158.07 Å/min. Moreover, NH$_4$F can be added, such as to Example 39C to help enhance TiN E/R with slightly increasing Cu E/R compared to Example 11F.

Example 5: Testing BZT as a Corrosion Inhibitor, Varying Temperature or Concentration of HEDTA as a Chelator/Oxidizer Stabilizer Example compositions 13E, 13F, 13H and 13I, were prepared and adjusted to temperatures of 40° C., 45° C., or 50° C., as shown in Table 5. The diluted compositions were admixed with hydrogen peroxide at a ratio 6 parts diluted composition to 4 parts 30% solution of H$_2$O$_2$ by weight.

TABLE 5

| Components | 13E (40° C.) | 13F (40° C.) | 13H (45° C.) | 13I (50° C.) |
|---|---|---|---|---|
| TAC | 1 | 1 | 1.2 | 1.2 |
| TEAH | 10.85 | 10.85 | 10.85 | 10.85 |
| HEDTA | 0.1 | 0.2 | 0.4 | 0.4 |
| EDTA | 0 | 0 | 0 | 0 |
| DIW | 87.75 | 87.65 | 87.65 | 87.15 |
| BZT | 0.3 | 0.3 | 0.3 | 0.4 |
| Total | 100 | 100 | 100 | 100 |
| Condition | D1H4 | D1H4 | D1H4 | D1H4 |
| E/R Co (15 min) | 1.03 | 1.55 | 2.06 | 1.29 |
| E/R Cu (15 min) | 0.97 | 1.35 | 1.88 | 1.78 |
| E/R TiN (5 min) | 28.42 | 32.67 | 156.41 | 199.64 |
| pH (22° C.) | 8.76 | 8.74 | 8.68 | 8.73 |

The concentrated compositions contained 10.85 wt percent of tetraethylammonium hydroxide, but varied in the amount of triammonium citrate (TAC) from 1.0 to 1.2 wt percent, the amount of hydroxyethylethylenediaminetriacetic acid (HEDTA) as chelating agent varied from 0.1 to 0.4 wt percent, and the amount of benzotriazole (BZT) as a corrosion inhibitor varied from 0.3 to 0.4 wt percent. Additionally, the temperature of the evaluated samples was varied. The concentrated compositions were diluted, and the oxidizing agent was added as described for earlier examples.

It was determined that for the examples, the etch rate of copper and cobalt was less than 2.06 Å/min, indicating good compatibility of the BZT containing formulation with those metals. Furthermore, the TiN etch rate appeared to increase with the elevated temperatures, presenting a TiN etch rate greater than 156 Å/min at a temperature of 45° C., with BZT present at 0.3 wt percent, and greater than 199 Å/min at a temperature of 50° C., with BZT present at 0.4 wt percent. The TiN etch rate at the lower temperature of 40 degrees C., with a BZT amount of 0.3 wt percent, and a HEDTA amount of 0.1 wt percent, was greater than 28 Å/min. Increasing the HEDTA to 0.2 wt percent, while maintaining the other conditions resulted in a TiN etch rate of 32 Å/min, without a significant impact upon the copper and cobalt etch rates.

Example 6: Testing Theophylline, Sorbitol and PEG400 as Corrosion Inhibitors and Gluconic Acid as a Chelating Agent/Oxidizer Stabilizer Example compositions 11R, 11T and 11O were prepared, diluted and the oxidizing agent was added as described above and tested for the times and temperatures as set forth in Table 6.

TABLE 6

| Component | 11R (40° C.) | 11R (45° C.) | 11T (40° C.) | 11T (45° C.) | 11O (40° C.) | 11O (45° C.) |
|---|---|---|---|---|---|---|
| TAC | 1 | 1 | 1 | 1 | 1 | 1 |
| TEAH | 10.85 | 10.85 | 10.85 | 10.85 | 10.85 | 10.85 |
| Gluconic acid | 0.1 | 0.1 | 0.1 | 0.1 | 0.1 | 0.1 |
| DIW | 86.41 | 86.41 | 86.96 | 86.96 | 86.96 | 86.96 |
| Corrosion inhibitor | Theophylline = 1.64 | Theophylline = 1.64 | Sorbitol = 1.09 | Sorbitol = 1.09 | PEG400 = 1.09 | PEG400 = 1.09 |
| Total | 100 | 100 | 100 | 100 | 100 | 100 |
| Condition | D1H4 | D1H4 | D1H4 | D1H4 | D1H4 | D1H4 |
| E/R Co (15 min) | 1.41 | 1.32 | 0.84 | 1.12 | 1.01 | 0.93 |
| E/R Cu (15 min) | 1.01 | 1.13 | 1.24 | 1.51 | 1.44 | 1.65 |
| E/R TiN (5 min) | 31.88 | 106.97 | 32.28 | 93.69 | 30.28 | 198.14 |

As can be seen with reference to Table 6, the formulations having theophylline, sorbitol and PEG400 as corrosion inhibitors and gluconic acid as a chelating agent were determined to have good compatibility with copper and cobalt materials, and displayed a TiN etch rate of in excess of 30 Å/min at temperature of 40° C., and even greater performance at the elevated temperature of 45° C., having an TiN etch rate of 107 Å/min with gluconic acid present at 0.1 wt percent with theophylline, and 93.7 Å/min is the gluconic acid which is 0.1 wt percent with sorbitol. For PEG400 case, example 11O has similar copper and cobalt compatibility at 40 and 45° C. but higher TiN etch rate of 198 Å/min at 45° C.

Example 7: Aniline Derivatives and Sorbitol as Dual Corrosion Inhibitor

Example compositions 36H and 36I were prepared, diluted compositions and the oxidizing agent was added as described above and tested for the times and temperatures as set forth in Table 7.

TABLE 7

| Components | 36H (45° C.) | 36I (45° C.) |
|---|---|---|
| TAC | 1 | 1 |
| TEAH | 10.85 | 10.85 |
| EDTA | 0.0125 | 0.0125 |

TABLE 7-continued

| Components | 36H (45° C.) | 36I (45° C.) |
|---|---|---|
| 3,4-Diaminotoluene | 0.5 | 0 |
| p-Anisidine | 0 | 0.5 |
| DIW | 86.55 | 86.55 |
| Sorbitol | 1.09 | 1.09 |
| Total | 100 | 100 |
| Condition | D1H4 | D1H4 |
| E/R TiN   5 min | 77.12 | 74.56 |
| E/R Cu   15 min | 1.39 | 1.42 |
| E/R Co   15 min | 1.33 | 1.8 |
| pH | 8.71 | 8.73 |

As can be seen with reference to Table 7, aniline type corrosion inhibitor, such as 3,4-diaminotoluene or p-anisidine and sorbitol were used with EDTA as a chelating agent to provide good Co and Cu compatibility. Examples 36H and 36I have TiN etch rates in excess of 74 Å/min at temperature of 45° C.

Example 8: Higher Amount Oxidizing Agent of Sorbitol and Theophylline-Based Formulations Examples compositions 11F, and 9C were prepared as shown in Table 8, adjusted to D1H5 (dilution and hydrogen period solution added thereto) and tested at 50 and 55° C.

TABLE 8

| Components | 11F | 9C |
|---|---|---|
| TAC | 1 | 1 |
| TEAH | 10.85 | 10.85 |
| EDTA | 0.0125 | 0.0125 |
| DIW | 87.05 | 86.5 |
| Corrosion inhibitor | sorbitol = 1.09 | theophylline = 1.64 |
| Total | 100 | 100 |
| Condition | D1H5 | D1H5 |
| E/R TiN @50° C., (1.5 min) | 115.42 | 114.61 |
| E/R Cu @50° C., (15 min) | 1.11 | 1.31 |
| E/R TiN @55° C., (1.5 min) | 216.37 | 200.33 |
| E/R Cu @55° C., (15 min) | 1.71 | 1.47 |

In order to achieve higher TiN E/R, it is possible to increase $H_2O_2$ in D1H5. D1H5 indicates having 5 parts of the diluted composition (1:10 concentrated composition: DIW as mentioned above) mixed with 5 parts 30% solution of hydrogen peroxide by weight. As shown in Table 8, in both Example 11F (sorbitol-based formulation) and Example 9C (theophylline-based formulation) the TiN E/R are higher than 200 Å/min and Cu E/R remain less than 2 Å/min at 55° C. The TiN E/R is greater than 114 Å/min and the Cu E/R is less than 2 Å/min at 50° C.

Example 9: The Following Example 11F in Table 9 was Made without Dilution Prior to Adding the Oxidizing Agent

TABLE 9

| Components | 11F (45° C.) | | | | |
|---|---|---|---|---|---|
| TAC | 1 | | | | |
| TEAH | 10.85 | | | | |
| EDTA | 0.0125 | | | | |
| DIW | 87.05 | | | | |
| Sorbitol | 1.09 | | | | |
| Total | 100 | | | | |
| | Bath life (hour) | | | | |
| | $0^{th}$ | $8^{th}$ | $16^{th}$ | $24^{th}$ | $32^{th}$ | $48^{th}$ |
| Condition | $H_2O_2$:concentrated composition = 9:1 | | | | |
| E/R Co 15 min | 2.41 | 2.14 | 2.44 | 2.04 | 1.60 | 1.55 |
| E/R Cu 15 min | 1.45 | 1.4 | 1.63 | 1.42 | 1.42 | 2.44 |
| E/R TiN 3 min | 342.1 | 343.33 | 329.84 | 327.29 | 331.97 | 255.43 |
| pH | 7.72 | 7.73 | 7.79 | 7.83 | 8.04 | 8.24 |
| [$H_2O_2$] | 27.00% | 26.18% | 26.18% | 25.36% | 23.15% | 21.68% |

Preparing a cleaning composition having 9:1 of 30% solution of $H_2O_2$ and the 11F mixture by weight (concentrated composition, without a dilution step to create the dilution composition), provided high TiN E/R and good Cu compatibility. Example 11F benefited from a lower pH to provide long bath life, that is, more than 32 hrs. Example 11F (concentrated composition, without a dilution step to create the dilution composition) with its increased concentration of components and lower pH may be operated in the circulation mode as well as drain mode.

Example 10: Varied Concentration Formulations

Example compositions of 17P and 17R were prepared as shown in Table 10 and adjusted in a ratio of D8H5 and D6H5 at 50° C.

TABLE 10

| Components | 17P (50° C.) | 17R (50° C.) |
|---|---|---|
| TAC | 0.4 | 0.2 |
| TEAH | 10.85 | 10.85 |
| EDTA | 0.0125 | 0.0125 |
| DIW | 87.65 | 87.85 |
| Sorbitol | 1.09 | 1.09 |
| Total | 100 | 100 |
| Condition | D8H5 D6H5 | D8H5 |
| E/R TiN (1.5 min) | 140.72 138.7 | 161.64 |
| E/R Cu (15 min) | 4.82 1.8 | 1.11 |
| pH | 9.06 8.93 | 9.08 |

D8H5 means 8 parts of concentrated composition and 10 parts of DIW was used to make the diluted composition as D8. And the diluted compositions (D8) were then admixed with hydrogen peroxide at a ratio of 5 parts diluted composition to 5 parts 30% solution of hydrogen peroxide by weight. D6H5 means 6 parts of the concentrated composition and 10 parts of DIW were combined to make the diluted composition as D6. And the diluted compositions (D6) were admixed with hydrogen peroxide at a ratio of 5 parts diluted composition to 5 parts 30% solution of hydrogen peroxide by weight. Example 17P and Example 17R both have higher chemical parts which means more TEAH to provide higher pH and TAC to give higher TiN E/R. More corrosion inhibitor can reduce Cu E/R. Examples 17P and 17R may also be operated in a circulation mode.

Example 11: TTL as a Corrosion Inhibitor

TABLE 11

| Components | 39V (40° C.) | 39S (40° C.) | 39U (40° C.) | 39T (40° C.) |
|---|---|---|---|---|
| TAC | 1 | 1 | 1 | 1 |
| TEAH | 10.85 | 10.85 | 10.85 | 10.85 |
| HEDTA | 0.02 | 0.02 | 0.02 | 0.02 |
| DIW | 88.03 | 88.12 | 88.125 | 88.129 |
| TTL | 0.1 | 0.01 | 0.005 | 0.001 |
| Total | 100 | 100 | 100 | 100 |
| Condition | D1H4 | D1H4 | D1H4 | D1H4 |
| TiN E/R 5 min | 42.42 | 42.21 | 40.79 | 39.45 |
| Cu E/R 15 min | 0.9 | 0.6 | 0.7 | 1.33 |

Examples 39V, 39S, 39U and 39T were made with 0.1 wt % to 0.001 wt % of TTL in the concentrated compositions, that were diluted with DIW and then mixed with a 30% solution of $H_2O_2$ in accordance with D1H4. These cleaning compositions provided good Cu compatibility and stable TiN etch rate even with the trace amount of TTL.

Example 12: Residue Test by XPS

Example compositions 9C, 8M and 11Q, were prepared as shown in Table 12, diluted with water, mixed with 30% solution of $H_2O_2$ and adjusted to 40° C.

TABLE 12

XPS analysis of different corrosion inhibitor formulations

| Components | 9C | 8M | 11Q |
|---|---|---|---|
| TAC | 1 | 1 | 1 |
| TEAH | 10.85 | 10.85 | 10.85 |
| EDTA | 0.0125 | 0.0125 | 0.0125 |
| DIW | 86.5 | 88.04 | 88.04 |
| Corrosion inhibitor | theophylline = 1.64 | BZT = 0.1 | pyrazole = 0.1 |
| Total | 100 | 100 | 100 |
| Condition | D1H3 | D1H3 | D1H3 |

Table 12 shows compositions having varying corrosion inhibitors, namely theophylline at 1.64 wt percent, BZT at 0.1 wt percent, and pyrazole at 0.1 wt percent in the concentrated compositions. All compositions also contained, triammonium citrate, EDTA, TEAH and DI water. The diluted compositions were admixed by weight with hydrogen peroxide at a ratio 7 parts diluted chemical to 3 parts 30% solution of $H_2O_2$.

Figure 1:
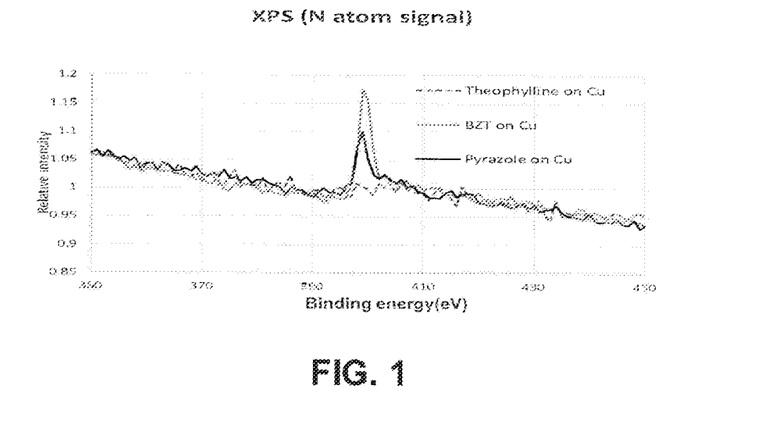
FIG. 1 is a graph depicting the results of X-ray photoelectron spectroscopy (XPS) testing of Cu blanket wafers treated in a composition containing one of theophylline, benzotriazole (BZT), and pyrazole.
Figure 2:
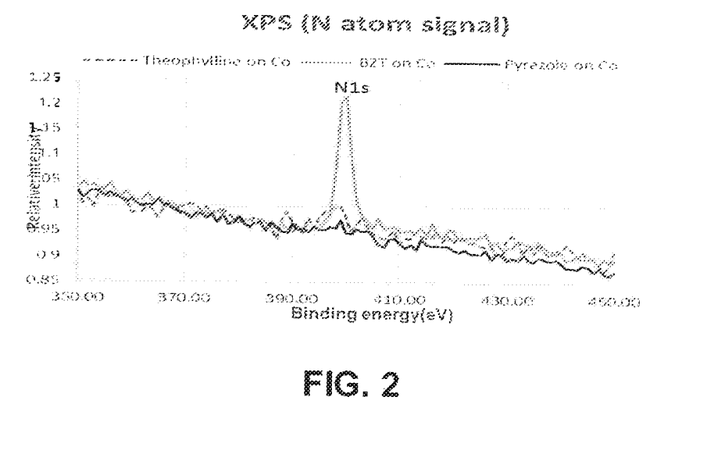
FIG. 2 is a graph depicting the results of XPS testing of Co blanket wafers treated in a composition containing one of theophylline, benzotriazole (BZT), and pyrazole.

Cu and Co blanket wafers were dipped into the formulations of Table 12, for 5 minutes. The wafers were then rinsed for 3 minutes in DIW and dried under nitrogen gas, as has been described previously. The tested copper wafers were then subjected to XPS analysis, using standard techniques and were used to generate FIGS. 1 and 2. With reference to FIGS. 1 and 2, it can be seen that the theophylline formulation did not appear to leave a discernable residue on the tested surfaces, as evidenced by the lack of a peak corresponding to the nitrogen element that is present in theophylline sample. Pyrazole and BZT based formulation did leave a discernable residue on Cu (FIG. 1). This indicates that the corrosion inhibitor of theophylline was removed with the DIW rinse, and thus would not require an additional post-processing step, such as exposure to dilute hydrofluoric acid, to remove any residue that would remain on the wafer surface. Same situation on Co, (FIG. 2) theophylline and pyrazole did not appear to leave a discernable residue on the tested surfaces, as evidenced by the lack of a peak corresponding to the nitrogen element that is present in theophylline and pyrazole sample. The BZT containing formulation did leave a discernable residue on Co. This indicates that the corrosion inhibitors of theophylline and pyrazole were removed with the DIW rinse, and thus would not require an additional post-processing step, such as exposure to dilute hydrofluoric acid, to remove any residue that would remain on the wafer surface.

Example 13: Corrosion Inhibitor Effect on CuOx Performance

For the copper loss issue, we found that copper oxide thickness was an important indicator to differentiate the copper-protection ability, because the actual copper loss would be affected by copper oxide thickness after removal by dilute hydrofluoric acid during wafer or device processing.

TABLE 13

Examples of inhibitor effect of copper oxide thickness.

| Component | 12P | 12Q | 12R | 12S | 12T | 12U | 12V | 13C | 13D | 13E | 13F |
|---|---|---|---|---|---|---|---|---|---|---|---|
| citric acid | 1.006 | 1.006 | 1.006 | 1.006 | 1.006 | 1.006 | 1.006 | 1.01 | 1.01 | 1.01 | 1.01 |
| DIW | 85.3 | 85.19 | 85.19 | 85.19 | 85.19 | 85.19 | 85.19 | 85.19 | 85.19 | 85.19 | 85.19 |
| TEAH | 12.09 | 12.09 | 12.09 | 12.09 | 12.09 | 12.09 | 12.09 | 12.09 | 12.09 | 12.09 | 12.09 |
| EDTA | 0.346 | 0.346 | 0.346 | 0.346 | 0.346 | 0.346 | 0.346 | 0.346 | 0.346 | 0.346 | 0.346 |
| TAC triammonium citrate | 1.257 | 1.257 | 1.257 | 1.257 | 1.257 | 1.257 | 1.257 | 1.257 | 1.257 | 1.257 | 1.257 |
| Sorbitol | | 0.11 | | | | | | | | | |
| (methyl-1H-benzotriazole) TTL | | | 0.11 | | | | | | | | |
| 4-Nitroaniline | | | | 0.11 | | | | | | | |
| p-Anisidine | | | | | 0.11 | | | | | | |
| 4-Methyl-o-phenylenediamine | | | | | | 0.11 | | | | | |
| N,N-Dimethyl-p-phenylenediamine | | | | | | | 0.11 | | | | |
| 4-carboxy-o-phenylenediamine | | | | | | | | 0.11 | | | |
| 8-Aminoquinoline | | | | | | | | | 0.11 | | |
| 5-Amino-2-benzimidazolinone | | | | | | | | | | 0.11 | |
| BZT | | | | | | | | | | | 0.11 |
| total | 100 | 100 | 100 | 100 | 100 | 100 | 100 | 100 | 100 | 100 | 100 |
| Condition | D1H4 | D1H4 | D1H4 | D1H4 | D1H4 | D1H4 | D1H4 | D1H4 | D1H4 | D1H4 | D1H4 |
| CuOx thickness (Å) | 50 | 40 | 30 | 37 | 36.7 | 29 | 38.4 | 38 | 37.7 | 38 | 30 |

As Table 13 indicates the copper oxide thickness can be reduced by adding the copper corrosion inhibitors into the formulation. It was also discovered that in some embodiments corrosion inhibitor with amino group may provide better copper oxide thickness performance.

Example 14: Different Etchant Effect on TiN Etching Rate

For TiN removal, Examples 18E, 18K and 18L were prepared as set in Table 14.

TABLE 14

Examples of etchant effect of TiN etching rate.

| Component | 18E | 18K | 18L |
|---|---|---|---|
| DETA (Diethylenetriamine) | | 3 | |
| MEA (monoethanolamine) | 3 | | |
| DBU (1,8-Diazabicyclo (5.4.0)undec-7-ene) | | | 3 |
| TAC | 1 | 1 | 1 |
| EDTA | 0.02 | 0.02 | 0.02 |
| NH4F | 1.2 | 1.2 | 1.2 |
| TTL | 0.11 | 0.11 | 0.11 |
| DIW | 94.67 | 94.67 | 94.67 |
| Total | 100 | 100 | 100 |
| Condition | D1H4 | D1H4 | D1H4 |
| TiN E/R @40° C. (5 min) | 34.13 | 21.62 | 18.2 |

Table 14 shows compositions having varying etchant, namely diethylenetriamine at 3 wt percent, monoethanolamine at 3 wt percent, and 1,8-diazabicyclo (5.4.0)undec-7-ene at 3 wt percent in the concentrated compositions. All compositions also contained, triammonium citrate, EDTA, ammonium fluoride and DI water. After dilution with DIW, the diluted compositions were admixed with hydrogen peroxide at a ratio 6 parts diluted chemical to 4 parts 30% solution of $H_2O_2$ by weight. The testing and testing time were as described earlier. The temperature was 40° C. The TiN etch rate was measured as described earlier.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations are not regarded as a departure from the spirit and scope of the invention, and all such variations are intended to be included within the scope of the following claims.

The invention claimed is:

1. A composition for selectively removing at least one of titanium nitride and photoresist etch residue material from the surface of a microelectronic device having same thereof, said composition consisting of:
   a solvent which is water and/or one or more non-aqueous solvents;
   tetraethylammonium hydroxide (TEAH);
   triammonium citrate (TAC);
   a metal corrosion inhibitor selected from the group consisting of sorbitol, benzotriazole (BZT), PEG 400, pyrazole and theophylline; and
   an oxidizing stabilizer selected from the group consisting of ethylenediaminetetraacetic acid (EDTA), gluconic acid and N-2-bis(carboxymethyl)aminoethyl-N-(2-hydroxy ethyl) glycine (HEDTA);
   wherein the composition has a pH ranging from 5.5 to 14.

2. The composition of claim 1, wherein the metal corrosion inhibitor is sorbitol.

3. The composition of claim 1, wherein the metal corrosion inhibitor is benzotriazole (BZT).

4. The composition of claim 1, wherein the metal corrosion inhibitor is theophylline.

5. The composition of claim 1, wherein the metal corrosion inhibitor is PEG 400.

6. The composition of claim 1, wherein the metal corrosion inhibitor is pyrazole.

7. The composition of claim 1, wherein the oxidizing stabilizer is ethylenediaminetetraacetic acid (EDTA).

8. The composition of claim 1, wherein the oxidizing stabilizer is gluconic acid.

9. The composition of claim 1, wherein the oxidizing stabilizer is N-2-bis(carboxymethyl)aminoethyl-N-(2-hydroxyethyl)glycine (HEDTA).

10. The composition of claim 1 consisting of:
    water;
    tetraethylammonium hydroxide (TEAH);
    triammonium citrate (TAC);
    sorbitol; and
    ethylenediaminetetraacetic acid (EDTA).

11. The composition of claim 1 consisting of:
    about 87 wt % water;
    about 10 wt % to about 11 wt % of neat tetraethylammonium hydroxide (TEAH);
    about 1 wt % triammonium citrate (TAC);
    about 1 wt % to about 1.1 wt % sorbitol; and
    about 0.0125 wt % ethylenediaminetetraacetic acid (EDTA).

12. The composition of claim 1, wherein the solvent is water.

13. The composition of claim 1, wherein the solvent is one or more non-aqueous solvents selected from the group consisting of sulfolane, dimethyl sulfoxide (DMSO), dimethyl sulfone ($DMSO_2$), DMAC, n-methylpyrrolidone (NMP), diethylene glycol butyl ether, proplyglycol, ethylene glycol, dipropyleneglycolmethyl ether, tripropyleneglycolmethyl ether and combinations thereof.

14. A system for selectively removing titanium nitride from a surface of a microelectronic device, comprising: a semiconductor device comprising titanium nitride and a second material selected from the group consisting of Cu, Co, low-k dielectric material and combinations thereof, and the composition of claim 1 for selectively removing the titanium nitride, wherein the titanium nitride and the second material are in direct contact with the composition.

15. A method of selectively removing titanium nitride comprising: providing a semiconductor device comprising the titanium nitride and a second material selected from the group consisting of Cu, Co, low-k dielectric material; diluting the composition of claim 1 with a solvent to form a diluted composition; and contacting the semiconductor device with the diluted composition.

16. A method of selectively removing titanium nitride comprising: providing a semiconductor device comprising the titanium nitride and a second material selected from the group consisting of Cu, Co, low-k dielectric material; diluting the composition of claim 10 with a solvent to form a diluted composition; and contacting the semiconductor device with the diluted composition.

* * * * *